United States Patent [19]

Delorme et al.

[11] 4,116,376

[45] Sep. 26, 1978

[54] METHOD OF MOUNTING INTEGRATED CIRCUIT CHIPS ON A SUBSTRATE AND APPARATUS FOR CARRYING OUT THE METHOD

[75] Inventors: Raymond Louis Delorme, Bagnolet; Henri Grosjean, Le Plessis-Trevise, both of France

[73] Assignee: Compagnie International pour l'Informatique Cii-Honeywell Bull (Societe Anonyme), Paris, France

[21] Appl. No.: 801,787

[22] Filed: May 31, 1977

[30] Foreign Application Priority Data

Sep. 20, 1976 [FR] France .................. 76 28170

[51] Int. Cl.$^2$ ............... B23K 1/12; H01L 21/60
[52] U.S. Cl. .................. 228/170; 228/6 A; 228/13; 228/56.5; 228/180 A; 228/105
[58] Field of Search .......... 228/6 A, 13, 56.5, 180 A, 228/170, 105

[56] References Cited

U.S. PATENT DOCUMENTS

| | | | |
|---|---|---|---|
| 3,838,984 | 10/1974 | Crane et al. ............... | 228/180 A X |
| 3,887,783 | 6/1975 | Comette ..................... | 228/170 X |
| 3,946,931 | 3/1976 | Bahnck et al. ............. | 228/6 A X |

*Primary Examiner*—Al Lawrence Smith
*Assistant Examiner*—K. J. Ramsey
*Attorney, Agent, or Firm*—Cameron, Kerkam, Sutton, Stowell & Stowell

[57] ABSTRACT

Method and apparatus to enable integrated circuit chips to be accurately mounted on substrates. Each chip is precisely positioned with respect to connecting areas on the substrates to which it is soldered. To this end, a support block is movable horizontally along a predetermined path and adapted to receive a substrate provided with at least one set of connecting areas arranged in a predetermined configuration about a center. A cutting tool having on the one hand a cutting head movable along a working axis perpendicular to the path followed by the support block is arranged to pass through a first fixed point on the said path, and on the other hand a cutting die arranged in the path of the head is arranged to receive an integrated circuit chip mounted on a support. A soldering tool is provided consisting of a soldering head movable along a working axis parallel to the working axis of the cutting tool and which passes through a second fixed point on the path followed by the support block, along with a positioning assembly whose positioning axis is parallel to the working axes and passes through a third fixed point on the path followed by the support block.

The substrate is shifted with respect to the support block to cause the center of a set of connecting areas to coincide with the said positioning axis, and the support block is locked in position under the cutting tool and then under the soldering tool in such a way that a reference on the said support block successively occupies, with respect to the respective working axis of the two tools, the same positions as occupied with respect to the positioning axis. Finally, actuating means are included to control the movements of the cutting and soldering heads.

18 Claims, 9 Drawing Figures

METHOD OF MOUNTING INTEGRATED CIRCUIT CHIPS ON A SUBSTRATE AND APPARATUS FOR CARRYING OUT THE METHOD

CROSS REFERENCES TO RELATED APPLICATIONS

This application corresponds to French application No. 76 28170, filed in France on Sept. 20, 1976 under which a claim for priority is made.

BACKGROUND OF THE INVENTION

The present invention relates to a method of mounting integrated circuit chips on a substrate, and to apparatus for carrying out this method.

In the well-known technique of producing integrated circuits, a wafer cut from a monocrystal of semiconductor material, such as silicon, is subjected to a series of operations consisting of doping, masking, photoetching, and the ionic diffusion or implantation of doping impurities, thus forming within the wafer a plurality of identical regularly distributed integrated circuits. The wafer is then cut up into very small plates which are generally referred to as chips, each chip containing one complete set of integrated circuits. Each chip is provided with contact regions which are disposed in a predetermined configuration and which, by means of interface conductors soldered to them are intended to provide the electrical connections between each chip and an interconnecting base which is generally referred to as a substrate.

The chips are of very small dimensions and to make them less awkward to handle and easier to mount on a substrate, it has been proposed that they should be attached to a flexible support, such as a strip, made of an inextensible insulating material, the support being provided with openings to allow the chips to be mounted on it. Towards the centers of these openings extend overhanging interface conductors which are generally obtained by cutting away a conductive film which is formed on one of the faces of the supporting strip.

In each opening, the disposition of the free inner ends of the interface conductors matches that of the contact regions on a chip located in the center of the opening. This being the case, the chips are mounted on the support by positioning them under respective ones of the openings in the support in such a way that the contact regions on each chip line up with respective ones of the inner ends of the interface conductors in the opening concerned, and then soldering these ends to the said contact regions.

The chips which have been mounted on the strip in this way may then be attached to a substrate. To this end, the interface conductors, whose inner ends are soldered to the contact regions on a chip, are cut at a short distance from the edges of the chip. Having been separated from the support in this way, the inoperative face (i.e., the face opposite from the face provided with the contact regions) of the chip is then positioned against the substrate and the ends of the portions of the interface conductors which remain overhanging from the chip are soldered to correspond conductive areas on the substrate. The disposition of the conductive areas on the substrate corresponds to that of the ends of these remaining portions, such that the conductive areas which are used to attach any one chip to the substrate are arranged in a predetermined configuration, for example, in a square with sides 5 mm long. When the chip is positioned against the substrate, it is necessary for the ends of the remaining portions of the interface conductors to be situated exactly opposite the connecting areas to which they are to be soldered. This operation proves very difficult in that the interface conductors are generally very small and very close together.

To position a chip against the substrate, it is possible to use the method which is described in U.S. Pat. No. 3,869,787, which consists in applying a layer of liquid to a flat area on the substrate, this area being of the same dimensions as the inoperative face of the chip and the liquid being capable of wetting this area and the inoperative face but not the other faces of the chip, and then placing the face so wetted of the chip against the area on the substrate, the correct alignment of the chip being then brought about by surface tension forces in the liquid.

This method, which does not always operate satisfactorily, also makes it necessary for the substrate to be provided with appropriate areas, which areas need to be of the same dimensions as the chips which they are intended to receive. This condition is made all the more difficult to meet by the fact that, when the wafer of semiconductor material is cut up, it is virtually impossible to obtain chips of absolutely identical dimensions, with the result that the format of the chips is not always the same as that of the said areas and sometimes certain chips are not properly aligned. In addition, this method requires care in its application, and takes a relatively long time to carry out and is therefore expensive.

SUMMARY OF THE INVENTION

The present invention seeks to overcome these disadvantages and provides a method and apparatus which enable chips to be mounted on a substrate in a reliable, inexpensive and relatively rapid fashion.

The invention provides a method of mounting, on a substrate provided with at least one set of connecting areas arranged in a predetermined configuration about a center, at least one integrated circuit chip which has previously been mounted on a support, and which is provided with connecting conductors which are attached to the said support and extend from the edges of the chip, comprising the steps of:

placing the support in a cutting tool, having a cutting head movable along a working axis and a cutting die arranged in the path of the said head, in such a way that the center of the chip is placed over the die and is aligned with the working axis;

placing the substrate on a support block movable in a direction perpendicular to the said working axis, the support block being provided with reference means and being initially positioned in such a way that the reference means are in predetermined positions with respect to a fixed positioning axis parallel to the said working axis;

shifting the substrate with respect to the support block to cause the center of a set of connecting areas on the substrate to coincide with the said fixed positioning axis, moving the support block to bring the substrate under the cutting tool, in such a way that the reference means occupy the same position with respect to the working axis of the said cutting tool as they occupied with respect to the positioning axis;

actuating the tool to cause the cutting head, in the course of its movement, to cut through the connecting conductors of the chip which has been positioned on the cutting die and separate the chip from its support, the chip thus separated from its support being carried along by the cutting head and positioned against the substrate;

after the cutting head has returned, moving the support block to bring the substrate under a soldering head movable along a working axis parallel to the positioning axis, in such a way that the reference means occupy the same position with respect to this working axis as they occupied with respect to the positioning axis;

actuating the said soldering head to press against the connecting areas on the substrate the portions of the connecting conductors remaining on the chip positioned against the substrate;

supplying power to the head to cause the said portions to be soldered to the said areas; and returing the soldering head to its initial position.

The invention also provides an apparatus for putting into effect the aforesaid method, which comprises, in combination, a movable support block, a cutting tool, a soldering tool, a positioning assembly, means enabling the substrate to be shifted with respect to the support block, locking means for acccurately positioning the support block under the tool and then under the soldering tool, and means for controlling the movements of the heads of these two tools.

BRIEF DESCRIPTION OF THE DRAWINGS

The invention will now be further described by way of example, with reference to the accompanying drawings, in which:

FIG. 2 is a general perspective view of apparatus for carrying out the method according to the invention.

FIGS. 4 to 7 are schematic views illustrating different phases of the method of mounting a chip on a substrate, the chip being so mounted by means of the apparatus shown in FIG. 2.

FIG. 9 is a cross-sectional view on line 9—9 of the carrier support shown in FIG. 3, this carrier support being assumed to have been positioned in the cutting tool which forms part of the apparatus shown in FIG. 2.

DESCRIPTION OF THE PREFERRED EMBODIMENT

Figure 1:
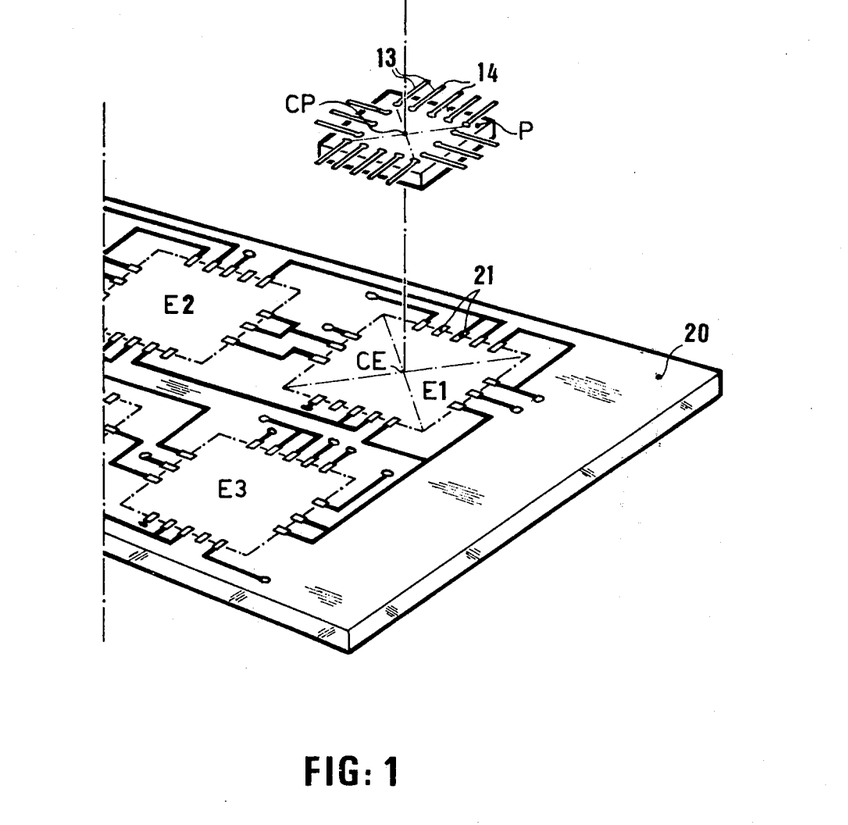
FIG. 1 is a perspective fragmentary view showing a portion of a substrate and an integrated circuit chip intended to be soldered to this substrate.
Figure 3:
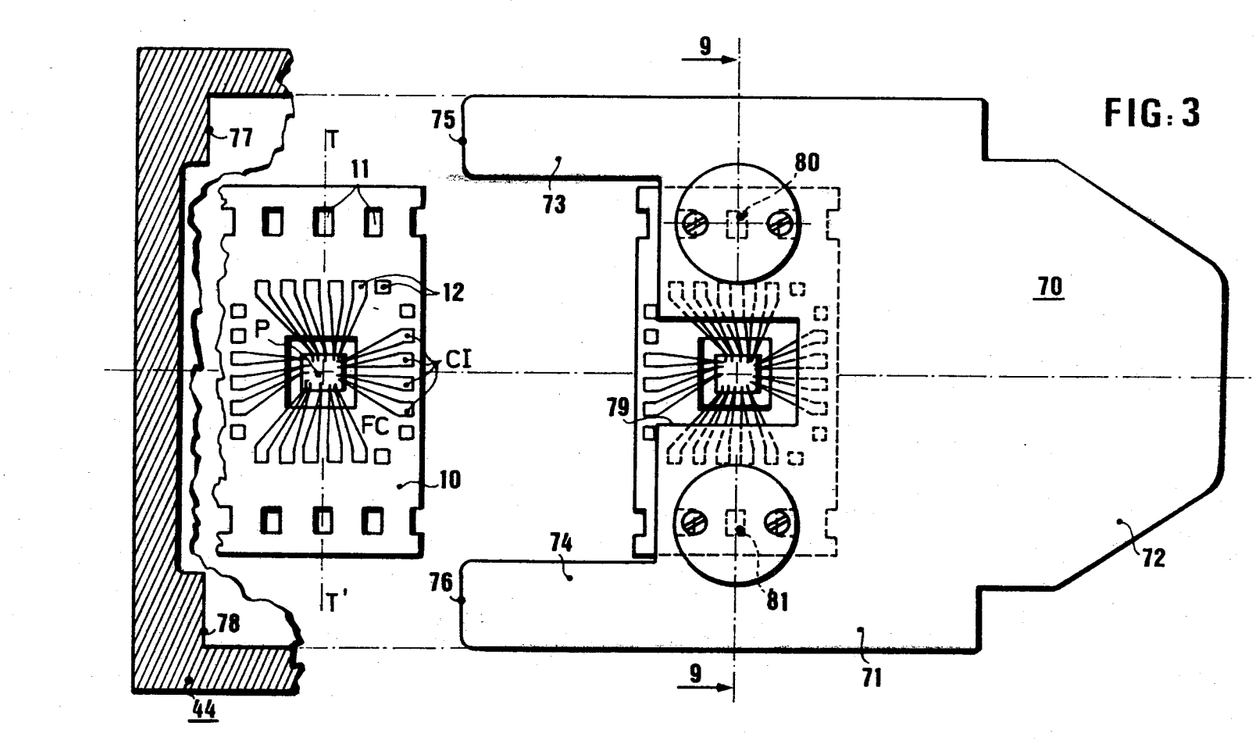
FIG. 3 is a view of the support carrier which enables an integrated circuit chip mounted on a flexible support to be easily positioned in the cutting tool which forms part of the apparatus shown in FIG. 2.

Referring to the drawings, FIG. 1 illustrates the way in which integrated circuit chips need to be positioned with respect to the substrate to which they are to be attached. It will be assumed that the chips have previously been mounted on a support 10, a fragment of which is shown in FIG. 3, this support being of a type similar to those which are described incidentally in patent applications Ser. No. 652,803 and Ser. No. 680,749 (now U.S. Pat. No. 4,038,744) which were filed in the United States and assigned to Cii Honeywell Bull, assignee of the present invention, on Jan. 27, 1976 and Apr. 27, 1976, respectively. Without going into detail, it will merely be mentioned by way of background and with reference to FIG. 3, that the support 10 is formed, in the sample being described, by a strip made of a substrate which is flexible, inextensible and an electrical insulator. This support 10 is provided on the one hand with regularly spaced lateral perforations 11 intended to allow it to be translated by a suitable device, and on the other hand with a plurality of axially aligned central openings FC at the center of each of which is mounted an integrated circuit chip P. The chip P adapted to be positioned at the center of each of these openings is connected to the support 10 by means of connecting conductors CI, also termed interface conductors. These connecting conductors are arranged in a radiating pattern around the opening. Each conductor has a portion which is attached to the support 10 and a portion which overhangs into the opening. In a known fashion, the inner ends of the interface conductors CI are soldered to contact regions on the chip which is situated at the center of the opening FC and towards which the interface conductors converge. The outer ends of the said interface conductors are shaped so as to form enlarged contact areas 12, these contact areas being preferably arranged about each opening in a standard configuration which may, for example, consist of 24 (4 × 6) contact areas disposed in a rectangle. As shown in FIG. 3, certain of the contact areas may be unused in which case the interface conductors which would otherwise extend from the chip to the contact areas are deleted.

The chips which are thus mounted on the support 10 may then be attached to a substrate. This operation requires each of the chips to be separated from the support, which is achieved by cutting the interface conductors which connect the chip to the support at a short distance from the edge of the chip. A chip P which has been separated from the support in this way is shown in FIG. 1. The said chip is intended to be attached to a substrate 20.

It can be seen from FIG. 1 that substrate 20 is provided on its upper face with connecting areas 21 which are connected to electrical circuits on the substrate. These connecting areas 21 are grouped into a certain number of sets of connecting areas which are referenced E1, E2, E3, etc. The connecting areas making up a given set, such as set E1, are arranged in a predetermined configuration which has a center of symmetry.

In the example shown in FIG. 1, each given set consists of sixteen connecting areas laid out in a square, this square having a center of symmetry indicated by reference CE. By way of example, it will be assumed that the chip P shown in FIG. 1 is intended to be attached to the connecting areas making up set E1. In order to achieve this, it is necessary for the chip, once detached from its support, to be correctly positioned with respect to the substrate, that is to say for the portions 13 of the interface conductors which remain attached to the chip to be exactly aligned with the connecting areas to which they are to be soldered.

In the position illustrated in FIG. 1, the ends 14 of the remaining portions of the interface conductors are situated exactly above respective ones of the connecting areas in set E. The center CP of the chip is aligned, as indicated in FIG. 1, with the center CE of the pattern in which the connecting areas are laid out. Once this aligning operation has been performed, the chip P is brought into contact with the substrate. In the course of this movement, orientation of the chip with respect to the substrate, remains unchanged. A suitable adhesive substance, such as a wax or a glue, enables the chip which has been so positioned against the substrate, to be restrained against moving and thus to remain in the correct position. After this, the ends 14 of the remaining portions of the interface conductors are soldered to the connecting areas making up set E1 in a manner which will be described below.

FIG. 2 shows the main parts of one embodiment of an apparatus embodying the present invention for putting into effect the subject inventive method described above. The substrate 20 is held, for example, by pneumatic suction, against a substrate-carrying block 30 mounted on a horizontal plate 31 which is in turn carried by a support block 32. Plate 31 can be shifted horizontally with respect to support block 32 in two mutually perpendicular directions X and Y. The movement in direction X is controlled by a fine pitch screw having a knurled head 33. The movement in direction Y is controlled by a fine pitch screw having a knurled head 34. The support block 32 is mounted to slide on two rails 35 and 36 which allow it to be moved horizontally in direction X. The two rails 35 and 36 are rigidly secured to a bed 37. A chassis 38, also secured to the bed 37, supports a positioning assembly 39 formed, in the embodiment being described, by a television camera 40 associated with a display screen 41. This camera is provided with a reticle whose lines cross on the sighting axis VV' of the camera and the image of which on the screen 41 enables the operator to position one of the sets of connecting areas on a substrate positioned under the camera with respect to axis VV', as will be seen below. It should, however, be noted that this type of positioning assembly does not restrict the invention and it could be replaced by any other type of apparatus which performed a similar function, such as, for example, a microscope. The bed 37 also supports a housing 42 on which are mounted modules forming the soldering tool 43 and a cutting tool 44. The cutting tool 44 is shown detached in FIG. 2 to enable certain details to be more clearly seen.

As can be seen in FIG. 2, the main constituent parts of the cutting tool 44 are accommodated witin the single module. These parts consist of a cutting head 45 attached to the lower end of a movable plate 46 which is able to slide vertically between two guides 47 and 48 forming sideways. When the movable plate 46 is actuated in a manner as as to cause the plate to descend, the head 45 moves along a vertical working axis DD' and passes through a cutting die 49 arranged in its path. The module in which all these parts are assembled, may be accurately positioned on the housing 42 by means of two locating pins 50 and 51 which are formed on the housing and engage in corresponding bores in the module when the latter is placed against the housing. The module is attached to the housing in a known fashion by means of quick-action looking screws (not shown).

The soldering tool 43, whose constituent parts are likewise accommodated within a single module, is of similar structure to the cutting tool except that it has no cutting die and instead of a cutting head, there is provided a soldering head 52 which is attached to the end of a movable plate 53 which is able to slide vertically. When plate 53 is actuated, the soldering head 52 moves along a vertical working axis SS'. Advantageously, in the embodiment being described, the module within which the principal parts of the soldering tool are assembled is detachable, its positioning against and attachment to the housing 42 being the same as in the case of the cutting tool module. Also, when the two modules are attached to the housing 42, the working axes DD' and SS', and also the sighting axis VV' of apparatus 39, intersect the horizontal plane defined by rails 35 and 36 at points which are equidistant from these two rails.

In the embodiment being described, where the support block 32 moves in a straight line, the three axes DD', SS' and VV' lie in the same vertical plane parallel to direction X. The cutting head of the cutting tool 44 is operated by an actuating arrangement of a known kind. For example, there may be utilized an electromechanical actuating arrangement similar to that described and illustrated in patent application Ser. No. 807,742, in the name of Raymond Delorme, filed in the United States on June 17, 1977 and assigned to the assignee of the instant application and is also described and illustrated in corresponding Belgian Pat. No. 851,573, allowed Mar. 17, 1977. The actuating arrangement, which is accommodated in housing 42, actuates the movable plate 46 and the cutting head 45 attached to it by means of an arm 220, part of which is shown in FIG. 2. This arm, when the cutting tool module is attached to housing 42, is coupled with an operating link (not shown in FIG. 2) which is housed within the module and is attached to the movable plate 46. A second actuating arrangement is mounted in housing 42. This second actuating arrangement is formed in the embodiment being described by an electromechanical actuating arrangement similar to that described and illustrated in the aforementioned patent application Ser. No. 807,742 and allows the soldering tool 43 to be operated.

FIG. 2 also shows that the support block 32 is provided with a reference mark 56, which, when the support block slides on rails 35 and 36, moves past a fixed bar 57, on which are engraved three adjusting marks indicated in FIG. 2 by reference characters RV, RS and RD. As can be seen in FIG. 4, which is a simplified schematic view of the installation shown in FIG. 2, the position of mark RV along bar 57 is so selected that, by moving the support block 32 to bring the substrate 20 below the viewing apparatus 39, it is possible to position reference mark 56 exactly opposite mark RV.

Figure 8:
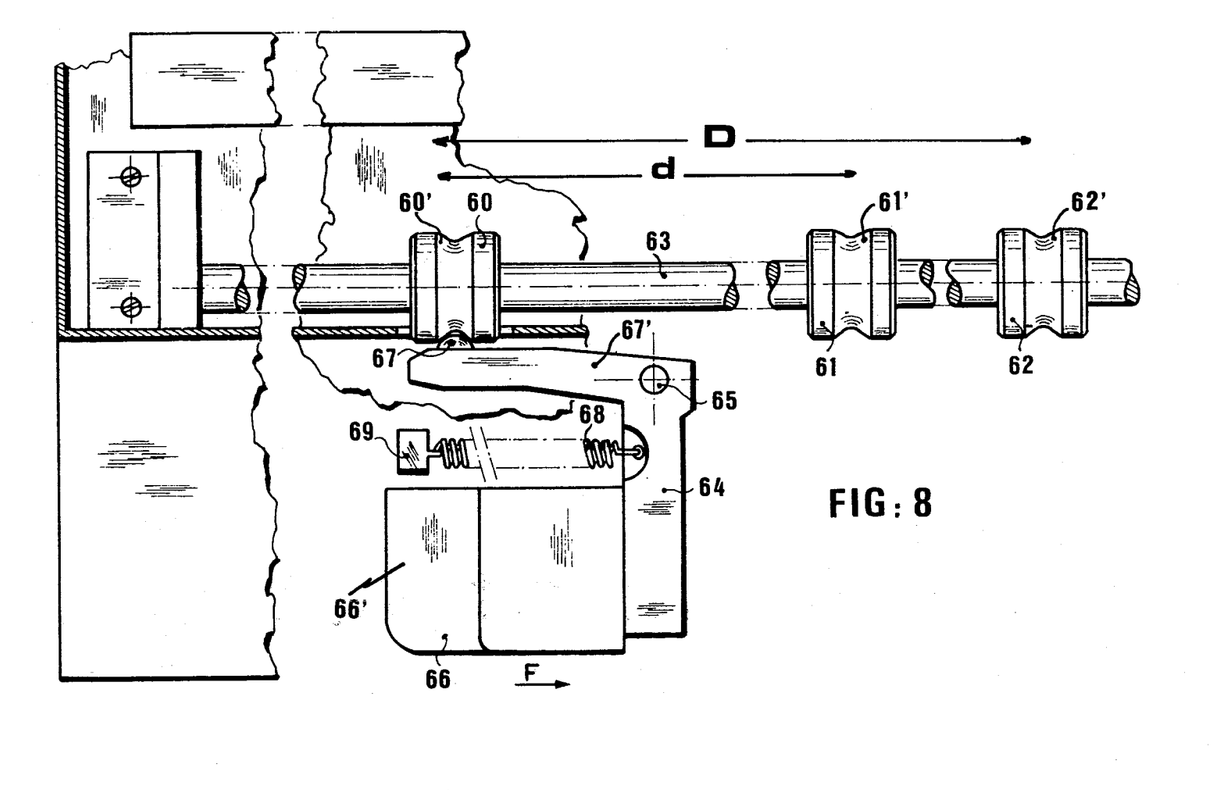
FIG. 8 is a partly cut-away view of the mechanism for locking the support block which forms part of the apparatus shown in FIG. 2.

To enable the support block 32 to be held stationary in this position, the installation is provided with precision locking means which, in the embodiment illustrated in FIG. 8, are formed, on the one hand, by a fixed locking part 60 and, on the other hand, a cranked lever 64. Part 60 in outline is in the shape of a centrally ground pulley, and is mounted on a rod or shaft 63 which is attached to the bed 37 of the apparatus and extends parallel to rails 35 and 36. Cranked lever 64 pivots about a vertical shaft 65 secured to support block 32. One of the arms 66' of lever 64 is provided with an operating nose 66 and the other arm 67' of the lever is fitted with a catch in the form of a ball bearing 67 which is adapted to engage in the groove (60' provided in the locking) part 60. Arm 67' is caused to move towards part 60 by a spring 68 which is tensioned, as shown in FIG. 8, between lever 64 and an attachment pin 69 secured to support block 32.

When the operating nose 66 is caused to move in the direction indicated by arrow F in FIG. 8, lever 64 pivots counter-clockwise about its shaft 65. The effect of this is to withdraw ball bearing 67 out of the groove of part 60 and thus unlock the support block 32. The support block may then be moved on racks 35 and 36 and brought under the soldering tool 53 or the cutting tool 44. Support block 32 can be selectively locked under each of the working tools 53 and 44 by means of two other fixed locking parts 61 and 62 (FIG. 8) spaced along rod 63 and each having a groove 61' and 62', respectively, in which the ball bearing catch 67 in lever 64 is able to engage. Locking parts 61 and 62, are identical in shape to part 60 and are secured to and separately adjustable on rod 63.

In FIG. 2, the locking means which have just been described are for the most part hidden by casings and all that can be seen are parts 60 and 62 and the operating nose 66. It should be noted that fixed part 61 is so positioned with respect to part 60 that the distance d between the grooves 60' and 61' in the two parts as shown in FIG. 8 is precisely equal to the distance betwen the sighting axis VV' and the working axis SS' shown in FIG. 4. Likewise, the distance between the two adjusting marks RV and RS is also equal to this distance d. Similarly, part 62 is so positioned with respect to part 60 that the distance D between the grooves 60' and 62' in the two parts as shown in FIG. 8 is precisely equal to the distance between the sighting axis VV' and the working axis DD' shown in FIG. 4. The distance between the two adjusting marks RV and RD is also equal to this distance D.

This being the case, it should be readily apparent that when the support block 32, which has been held stationary by part 60, is released from this part and is brought under the cutting tool 44 and then immobolized or locked in place by means of part 62, the position occupied by support block 32 with respect to working axis DD' is exactly the same as that which it previously occupied with respect to the sighting axis VV'. Similarly, if support block 32 is then released from part 62 and brought under the soldering tool 43 and immobolized by means of part 61, the position which it now occupies with respect to the working axis SS' will be exactly the same as that which it occupied with respect to working axis DD' when it was under the cutting tool 44, that is to say, it will be exactly the same as that which it occupied with respect to axis VV' when it was under the viewing apparatus 39. The result is that if, when the support block 32 is held stationary by locking part 60, plate 31 is shifted by means of adjusting screws 33 and 34 to enable the substrate 20 which has previously been positioned on the block 30 on this plate to be brought into a predetermined position with respect to the sighting axis VV', the substrate will be in exactly the same position with respect to one of the two axes SS' and DD' when the support block 32, having been released from part 60, is moved so as eventually to be locked under one or other of the working tools.

In order to mount on the substrate an integrated circuit chip, which has previously been attached to a flexible support of the type described above and using the apparatus just described, it is important that the chip, after being positioned under the cutting tool 44, should be exactly centered on the working axis DD' of the tool. In the preferred embodiment being described, this is advantageously achieved on the one hand, as best shown in FIG. 3, by using a support 10 in which the lateral perforations 11 and the central openings FC are so distributed that the two perforations which are situated substantially at right angles to each opening FC are exactly central in relation to opening FC, that is to say so that the axis of symmetry TT' which passes through these two perforations passes exactly through the center of the said opening, and on the other hand by using a detachable support carrier which will now be described, this support carrier enabling the support to be positioned with very great accuracy in the cutting tool.

The support carrier, which is not shown in FIG. 2, is formed in the embodiment being described by a plate 70 which is normally positioned in the cutting module 44 as shown in FIG. 9, that is to say over die 49 and just below the cutting head 45 which is assumed to beheld in its raised position.

If reference is now made to FIG. 3, it can be seen that the plate, which is indicated by reference 70, consists of a portion 71 which extends on one side into a tongue 72 which makes it easy for an operator to take hold of the plate. At the other side, the plate is provided with two integral extensions 73 and 74, the ends of which are machined to form two pads 75 and 76. Pads 75 and 76 when pressed against seats 77 and 78 formed in the body of the cutting module (FIG. 3), serve to locate the plate in the cutting tool 24.

As FIG. 3 shows, the portion 71 of plate 70 contains a cut-out 79 and is provided with two spigots 80 and 81 arranged on opposite sides of cut-out 79. The cross-sections of the two spigots are such that they provide a moderately hard interference fit in the two perforations situated at right angles to each of the central openings in the support 10. Exact positioning is achieved by engaging spigots 80 and 81 in bores 82 and 83 in the cutting tool as best shown in FIG. 9.

It should be mentioned here that, in the example being described where the support 10 is formed by a flexible strip containing a plurality of central openings at the center of each of which is mounted one integrated circuit chip, the strip is cut transversely, to enable it to be inserted in the cutting tool 44, into as many portions as it contains central openings, and each of these portions thus has a single central opening and all the interface conductors which converge towards this opening. One of these portions is shown in FIG. 3 in the position which it occupies when it has been placed in position on plate 70. The spigots 80 and 81 on plate 70 are engaged in those two perforations in the portion of the support which are situated along the central transverse axis and at right angles to the central opening in the portion of the support. The integrated circuit chip attached to this portion of the support thus occupies on the plate 70 a position such that, when the plate is engaged in the cutting tool 44 and has been accurately located by its spigots 80 and 81 in the bores 82 and 83 in the tool, the center CP of the chip is exactly aligned with the working axis DD' of the tool. It should also be mentioned that, when the plate is being inserted in the cutting tool, the edges of the chip remain absolutely parallel to the directions X and Y shown in FIG. 2 and referred to hereinbefore.

To enable the chip to be positioned against the set E1 of connecting areas on the substrate 20, it is important that the center CE of the set should likewise be exactly aligned with the axis DD' of the cutting tool 44. To achieve this result, the support block 32 is moved until mark 56 is opposite mark RV. The support block is thus moved under the viewing apparatus 39 as shown in FIG. 4. As indicated above, the support block 42 is locked in this position by the ball bearing 67 which engages in the groove 60' in part 60. Support block 32 having been immobilized in this way, the substrate 20 is placed on the substratecarrying block 30 in such a way that two of its edges rest against locating pins 90 (FIG. 2) which are provided for this purpose on the substrate carrying block. The substrate is then rendered immobile on the block 30 by means of pneumatic suction which is applied by operating a two-positioned control switch 85 shown in FIG. 2. Block 30 is then shifted manually to move onto the sighting axis VV' the center CE of the set E1 of connecting areas to which it is desired to attach the chip which has previously been placed in the cutting tool. The first movement is a rapid one to bring set E1 into the field of the camera 40 and to line up its framed image as closely as possible with the image of the cross lines of the reticle which can be seen on the screen. Block 30 is then rendered immobile in turn on plate 31 by means of a pneumatic suction which is applied by operating a two position control switch 84 shown in FIG. 2. An exact adjustment of the position of the set E1 of connecting areas is then made by using the fine adjusting screws 33 and 34. When the positioning of set E1 with respect to the sighting axis VV' has been completed, support block 32 is unlocked and is moved towards the cutting tool 44 until mark 56 comes opposite mark RD, as shown in FIG. 5. Support block 32 is locked in this new position by the ball bearing 67 on lever 64 as the bearing engages in the groove 621 in part 62.

As hereinbefore described, the substrate 20 which is attached to the substrate-carrying block 30 then occupies the same position with respect to the working axis DD' as it did with respect to the sighting axis VV' just after it had been set up by means of screws 33 and 34. This being the case, the center CE of set E1 coincides with the working axis DD' of the cutting tool 44. If at this moment the cutting tool 44 is brought into action by pressing press-button 86 (FIG. 2), the cutting head 45 descends as it inserts itself in the cutting die 49 cuts through the interface connectors of the chip which has previously been placed in the tool. The chip, having been detached from the portion of the support to which it had up to then been attached is, however, retained by the cutting head 45, for example, by pneumatic suction, and is then carried along by the head until it comes into contact with substrate 20, on which is an adhesive substance. It should be noted that in the course of this movement, the orientation of the chip does not alter and thus, the ends of the remaining portions of the interface conductors on the chip are exactly aligned with the connecting areas making up set E1 to which they are to be soldered. The chip is released by the head, which is caused to rise, and remains in position against the substrate 20 without moving, because of the adhesive substance which holds fast the inoperative face of the chip applied against the substrate. The support block 32 can then be unlocked and moved towards the soldering tool 43 until mark 56 comes opposite mark RS, as shown in FIG. 6. The support block 32 is held in this position by the ball bearing 67 on lever 64 which engages in the groove 61' in part 61. The substrate 20 which is attached to the substrate-carrying block 30 is then situated in a position such that the center CE of set E1, and also the center of the chip which has been positioned against this set, coincides with the working axis SS' of the soldering tool 43. If at this moment the soldering tool 43 is brought into action by pressing a press-button 87 (FIG. 2), the soldering head 52 descends and presses the ends of the remaining portions of the interface conductors on this chip against the corresponding connecting areas making up set E1. The soldering head 52 is then supplied with electricity for a predetermined length of time, which causes it to heat up by Joule effect and thus to solder the ends of these portions to the said connecting areas by the applied heat and pressure. After the head 52 is deenergized and soldered joints so formed have cooled, the soldering head 52 is raised to its original position. As soon as the rising movement has been completed, the support block 32 may be unlocked and brought back under the viewing apparatus 39, as shown in FIG. 4, to enable the operator to make a visual check on whether the chip has ben corrected mounted on the substrate. If it proves to have been correctly mounted, the operator removes from the cutting tool the plate 70 which had been inserted therein, so as to remove the remainder of the portion of the support which was left in the tool after the chip had been cut free. In cases where other integrated circuit chips are to be mounted on the same substrate, the phase of operations which has just been described may be repeated until the substrate has been provided with all the chips intended for it. When all these chips have been mounted, the operator, by changing over control switch 85 can switch off the pneumatic suction which until then had been holding the substrate immobile against block 30. The substrate is then removed by the operator and a fresh substrate, as yet not provided with chips, may be positioned in turn on the block 30, after which chips are mounted on the new substrate in the same way as has been described above.

It is clear from the foregoing description that the method and apparatus according to the invention enable integrated circuit chips to be mounted on substrates in an accurate and economical fashion. The conditions under which operations take place ensure that each chip is precisely positioned with respect to the connecting areas on the substrate to which it is to be soldered, and also that the soldered joints which are made will be of good quality.

Although the description and the accompanying drawings relate to a preferred embodiment of the invention, it is understood that any means which form technical equivalents of those described and illustrated may be used, separately or in combination, in the context of the following claims.

We claim:

1. A method of mounting on a substrate which is provided with at least one set of connecting areas arranged in a predetermined configuration about a center, at least one integrated circuit chip which has previously been mounted on a flexible support of inextensible insulating material, the said chip being provided with connecting conductors which are attached to the said flexible support and extend from the edges of the chip, comprising the steps of:

positioning the support containing the chip on a support carrier, placing the support carrier in a cutting tool having a cutting head movable along a working axis and a cutting die arranged in the path of the said head, in such a way that the center of the chip is placed over the die and is aligned with said working axis, placing the substrate on a support block movable in a direction perpendicular to the said working axis, initially positioning the support block such that a reference on said support block is aligned in predetermined positions with respect to a fixed positioning axis parallel to the said working axis, shifting the substrate with respect to the support block to cause the center of a set of connecting areas on the substrate to coincide with the said fixed positioning axis, moving the support block to bring the substrate under the cutting tool such that the reference means occupies the same position with respect to the working axis of the said tool as occupied with respect to the positioning axis, actuating the cutting tool to cause the cutting head, in the course of its movement, to cut through the connecting conductors of the chip which has been positioned on the cutting die, carrying the chip thus separated from its support along by the head and positioning said separated chip against the substrate, raising the head clear of the die and after the head has been so raised, moving the support block to bring the substrate under a soldering head movable along a working axis parallel to the positioning axis, in such a way that the reference means occupy the same position with respect to the working axis of the soldering head as occupied with respect to the positioning axis, actuating the soldering head to press against the connecting areas on the substrate the portions of the connecting conductors, remaining on the chip which has been positioned against the substrate, supplying power to the head to cause the said portions to be soldered to the said areas, and returning the soldering head to its initial position.

2. A method as set forth in claim 1 wherein said step of positioning said separated chip against the substrate includes adhering said chip against the substrate.

3. A method as set forth in claim 1 wherein the support block is locked in place when positioned under the cutting tool and under the soldering head.

4. Apparatus for mounting, on a substrate provided with at least one set of connecting areas arranged in a predetermined configuration about a center, at least one integrated circuit chip which has been previously mounted on a flexible support of inextensible insulating material, the said chip being provided with connecting conductors which are attached to the said flexible support and extend from the edges of the chip, comprising, in combination:

a support block movable horizontally along a predetermined path, said support block being provided with reference means and beng adapted to receive thereon a substrate provided with at least one set of connecting areas which are arranged in a predetermined configuration about a center, a cutting tool consisting on the one hand of a cutting head moveable along a working axis perpendicular to the path followed by the support block and which passes thorugh a first fixed point on the said path, and on the other hand of a cutting die arranged in the path of the said head, said cutting die being adapted to receive an integrated circuit chip mounted on the flexible support, a soldering tool including a soldering head movble along a working axis parallel to the working axis of the cutting tool and which passes through a second fixed point on the path followed by the support block, a positioning assembly having a positioning axis parallel to the said working axes and which passes through a third fixed point on the path followed by the suport block, means for shifting the substrate with respect to the support block to cause the center of a set of connecting areas on the substrate to coincide with the said positioning axis, locking means to position the support block under the cutting tool and then under the soldering tool in such a way that the reference means of the said support block successively occupy, with respect to the respective working axis of the two tools, the same positions as they occupied with respect to the positioning axis, the actuating means to control the movements of the cutting and soldering heads.

5. Apparatus according to claim 4 wherein the support block is mounted for movement in a straight line, the reference means being formed by an index mark which is attached to the said support block and, when the support block is moved, can be brought opposite any one of three fixed reference marks, the first of these reference marks being associated with the positioning axis, the second being associated with the working axis of the soldering tool, and the third being associated with the working axis of the cutting tool, the distance separating the second reference mark from the first being equal to the distance between the working axis of the soldering tool and the positioning axis and the distance separating the third reference mark from the first being equal to the distance between the working axis of the cutting tool and the positioning axis.

6. Apparatus as set forth in claim 5 wherein the flexible support includes two perforations arranged on either side of each opening along the central transverse axis thereof and at right angles thereto, and further including a detachable support carrier means for receiving the flexible support and accurately positining the flexible support in the cutting tool.

7. Apparatus as set forth in claim 6 wherein the support carrier means includes on the one hand two locating pads at one end adapted to bear against two corresponding seats in the cutting tool, and on the other hand two spigots at the other end adapted to provide an interference fit with the two perforations associated with any one of the said openings, said two spigots being so positioned that, when the support carrier is engaged in the cutting tool and the spigots are engaged in locating bores in the said tool, the chip which is attached in the said opening is centered on the working axis of the cutting tool.

8. Apparatus as set forth in claim 5 wherein the means for shifting the substrate consists of a plate mounted on the support block, said plate being movable in a plane perpendicular to the said positioning axis so as to enable the center of a set of connecting areas on the substrate to be made coincident with the said positioning axis.

9. Apparatus as set forth in claim 5 wherein the positioning assembly comprises a television camera having a reticle and associated display screen.

10. Apparatus as set forth in claim 5 which further includes a substrate-carrying block on which the substrate is placed and held immobile, a movable plate, the substrate-carrying block being attached to the movable plate and said plate being carried by said support block and shiftable with respect thereto in two mutually perpendicular directions.

11. Apparatus according to claim 4 wherein the locking means comprises a rod extending parallel to the direction of movement of the support block, said rod having three elements each in the shape of a centrally grooved pulley, a lever, and a ball bearing mounted on said lever, said lever being pivoted on a shaft secured to the support block.

12. Apparatus as set forth in claim 11, wherein said locking means includes a spring for urging the ball bearing towards the said rod, said spring being tensioned between the lever and a point of attachment on the support block.

13. Apparatus as set forth in claim 11 wherein said three elements are associated with respective ones of the fixed reference marks and so positioned that, when the index mark is situated opposite any one of the reference marks, the said ball-bearing is engaged in the groove of the element associated with this reference mark.

14. Apparatus as set forth in claim 13 wherein the flexible support includes two peforations arranged on either side of each opening along the central transverse axis thereof and at right angles thereto, and further including a detachable support carrier means for receiving the flexible support and accurately positioning the flexible support in the cutting tool.

15. Apparatus as set forth in claim 14 wherein the support carrier means includes on the one hand two locating pads at one end adapted to bear against two corresponding seats in the cutting tool, and on the other hand two spigots at the other end adapted to provide an interference fit with the two perforations associated with any one of the said openings, said two spigots being so positioned that, when the support carrier is engaged in the cutting tool and the spigots are engaged in locating bores in the said tool, the chip which is attached in the said opening is centered on the working axis of the cutting tool.

16. Apparatus as set forth in claim 13 wherein the means for shifting the substrate consist of a plate mounted on the support block, said plate being movable in a plane perpendicular to the said positioning axis so as to enable the center of a set of connecting areas on the substrate to be made coincident with the said positioning axis.

17. Apparatus as set forth in claim 16 wherein the positioning assembly comprises a television camera having a reticle and associated with a display screen.

18. Apparatus as set forth in claim 17 which further includes a substrate-carrying block on which the substrate is placed and held immobile, the substrate-carrying block in turn being attached to the movable plate.

* * * * *

UNITED STATES PATENT AND TRADEMARK OFFICE
CERTIFICATE OF CORRECTION

PATENT NO. : 4,116,376
DATED : September 26, 1978
INVENTOR(S) : Raymond Lewis Delorme, et al It is certified that error appears in the above-identified patent and that said Letters Patent are hereby corrected as shown below:

Claim 1, column 11, line 21, delete "," after "conductors"

Claim 4, column 11, line 43, correct spelling of "being" from "beng" to --being--.

Claim 4, column 11, line 50, change "thorugh" to "through".

Claim 4, column 11, line 63, change "suport" to "support".

Claim 4, column 12, line 7, delete "the", and substitute "and".

Claim 6, column 12, line 31, change "positining" to "positioning".

Claim 14, column 13, line 14, change "peforations" to "perforations".

Signed and Sealed this

Seventeenth Day of July 1979

[SEAL]

Attest:

LUTRELLE F. PARKER
*Attesting Officer*  *Acting Commissioner of Patents and Trademarks*